(12) United States Patent  
Hiramatsu et al.

(10) Patent No.: US 8,053,811 B2
(45) Date of Patent: Nov. 8, 2011

(54) GROUP 3-5 NITRIDE SEMICONDUCTOR MULTILAYER SUBSTRATE, METHOD FOR MANUFACTURING GROUP 3-5 NITRIDE SEMICONDUCTOR FREE-STANDING SUBTRATE, AND SEMICONDUCTOR ELEMENT

(75) Inventors: Kazumasa Hiramatsu, Yokkaichi (JP); Hideto Miyake, Tsu (JP); Yoshihiko Tsuchida, Tsukuba (JP); Yoshinobu Ono, Tsukubamirai (JP); Naohiro Nishikawa, Tsukuba (JP)

(73) Assignees: Sumitomo Chemical Company Limited, Tokyo (JP); National University Corporation Mie University, Tsu-shi, Mie (JP)

( * ) Notice: Subject to any disclaimer, the term of this patent is extended or adjusted under 35 U.S.C. 154(b) by 0 days.

(21) Appl. No.: 11/920,563

(22) PCT Filed: May 2, 2006

(86) PCT No.: PCT/JP2006/309166
§ 371 (c)(1),
(2), (4) Date: Dec. 14, 2007

(87) PCT Pub. No.: WO2006/123540
PCT Pub. Date: Nov. 23, 2006

(65) Prior Publication Data
US 2009/0085165 A1    Apr. 2, 2009

(30) Foreign Application Priority Data

May 19, 2005 (JP) .................................. 2005-146346
Sep. 5, 2005 (JP) .................................. 2005-256022

(51) Int. Cl.
*H01L 21/00* (2006.01)

(52) U.S. Cl. ............................ 257/190; 257/94; 257/615
(58) Field of Classification Search ................. 257/190, 257/200, 201, 615, E21.121, E21.126, 94
See application file for complete search history.

(56) References Cited

U.S. PATENT DOCUMENTS 6,177,359 B1    1/2001    Chen et al.
(Continued)

FOREIGN PATENT DOCUMENTS

JP    2000-223743    8/2000
(Continued)

OTHER PUBLICATIONS

Akira Usui et al., "Reduction of dislocation density of HVPE-grown GaN on sapphire substrate by using facet-initiated epitaxial lateral overgrowth technique," Journal of Japanese Society for Crystal Growth, 1999, vol. 26, No. 2, pp. 25-26.

(Continued)

*Primary Examiner* — Laura M Menz
(74) *Attorney, Agent, or Firm* — Fitch, Even, Tabin & Flannery

(57) ABSTRACT

A group 3-5 nitride semiconductor multilayer substrate (1) and a method for manufacturing such substrate are provided. A semiconductor layer (12) is formed on a base substrate (11), and a mask (13) is formed on the semiconductor layer (12). Then, after forming a group 3-5 nitride semiconductor crystalline layer (14) by selective growing, the group 3-5 nitride semiconductor crystalline layer (14) and the base substrate (11) are separated. The crystallinity of the semiconductor layer (12) is lower than that of the group 3-5 nitride semiconductor crystalline layer (14).

10 Claims, 6 Drawing Sheets

U.S. PATENT DOCUMENTS

| | | | |
|---|---|---|---|
| 6,225,650 B1* | 5/2001 | Tadatomo et al. | 257/190 |
| 6,346,720 B1* | 2/2002 | Iyechika et al. | 257/103 |
| 6,472,298 B2* | 10/2002 | Iyechika et al. | 438/493 |
| 6,503,610 B2 | 1/2003 | Hiramatsu et al. | 428/210 |
| 6,525,345 B1* | 2/2003 | Kadota | 257/94 |
| 6,562,644 B2 | 5/2003 | Ishida et al. | |
| 6,593,596 B1* | 7/2003 | Nanishi et al. | 257/94 |
| 6,617,235 B2* | 9/2003 | Iyechika et al. | 438/604 |
| 6,639,354 B1 | 10/2003 | Kojima et al. | |
| 6,806,502 B2* | 10/2004 | Iyechika et al. | 257/79 |
| 6,844,574 B1* | 1/2005 | Hiramatsu et al. | 257/190 |
| 6,852,161 B2* | 2/2005 | Urashima et al. | 117/104 |
| 6,924,159 B2* | 8/2005 | Usui et al. | 438/22 |
| 7,189,588 B2* | 3/2007 | Usui et al. | 438/22 |
| 7,399,687 B2* | 7/2008 | Hiramatsu et al. | 438/483 |
| 2001/0014426 A1 | 8/2001 | Michiels et al. | 430/5 |
| 2001/0026950 A1* | 10/2001 | Sunakawa et al. | 438/47 |
| 2001/0031385 A1* | 10/2001 | Hiramatsu et al. | 428/698 |
| 2002/0125491 A1* | 9/2002 | Shibata et al. | 257/94 |
| 2002/0168844 A1 | 11/2002 | Kuramoto et al. | |
| 2002/0197825 A1* | 12/2002 | Usui et al. | 438/459 |
| 2003/0045017 A1* | 3/2003 | Hiramatsu et al. | 438/46 |
| 2005/0048685 A1* | 3/2005 | Shibata | 438/46 |
| 2006/0033119 A1* | 2/2006 | Shibata | 257/103 |
| 2006/0046325 A1* | 3/2006 | Usui et al. | 438/21 |
| 2006/0172512 A1* | 8/2006 | Hiramatsu et al. | 438/483 |
| 2009/0085165 A1* | 4/2009 | Hiramatsu et al. | 257/615 |
| 2009/0278233 A1* | 11/2009 | Pinnington et al. | 257/615 |
| 2010/0068872 A1* | 3/2010 | Chyi et al. | 438/507 |
| 2011/0012109 A1* | 1/2011 | Kryliouk et al. | 257/49 |

FOREIGN PATENT DOCUMENTS

| | | |
|---|---|---|
| JP | 2001-53056 | 2/2001 |
| JP | 2002-170778 | 6/2002 |
| JP | 2004-39810 | 2/2004 |
| JP | 2004-273661 | 9/2004 |
| WO | WO 02/01608 A2 | 1/2002 |

OTHER PUBLICATIONS

Yuichi Oshima et al., "Preparation of Freestanding GaN Wafers by Hydride Vapor Phase Epitaxy with Void-Assisted Separation," Japanese Journal of Applied Physics, vol. 42, Part 2, No. 1A/B, Jan. 2003, pp. L1-L3.

Shuji Nakamura, "GaN Growth Using GaN Buffer Layer," Japanese Journal of Applied Physics, vol. 30, No. 10A, Oct. 1991, pp. L1705-L1707.

Japanese Office Action issued Feb. 28, 2011, in corresponding Japanese Application 2005-256022.

* cited by examiner

GROUP 3-5 NITRIDE SEMICONDUCTOR MULTILAYER SUBSTRATE, METHOD FOR MANUFACTURING GROUP 3-5 NITRIDE SEMICONDUCTOR FREE-STANDING SUBTRATE, AND SEMICONDUCTOR ELEMENT

This Application is the National Phase of International Application No. PCT/JP2006/309166 filed May 2, 2006, which designated the U.S. and was not published under PCT Article 21(2) in English, and this application claims, via the aforesaid International Application, the foreign priority benefit of and claims the priority from Japanese Application Nos. 2005-146346, filed May 19, 2005 and 2005-256022, filed Sep. 5, 2005, the complete disclosure of each of the foregoing applications is incorporated herein by reference.

TECHNICAL FIELD

The present invention relates to a multilayer substrate of a Group 3-5 nitride semiconductor, a method of making a free-standing substrate of a Group 3-5 nitride semiconductor, and a semiconductor device.

BACKGROUND ART

A Group 3-5 nitride semiconductor has been used for making a semiconductor device applied to various display devices. For example, as a material for a light-emitting device such as an ultraviolet or blue light-emitting diode, or a laser diode, or for a high-output or high-frequency electronic device, a compound semiconductor represented by a general formula: $In_xGa_yAl_zN$, wherein $x+y+z=1$, $0 \leq x \leq 1$, $0 \leq y \leq 1$ and $0 \leq z \leq 1$, are known. The compound semiconductor will be abbreviated as "a Group 3-5 nitride semiconductor".

By the way, although a method of forming the light-emitting device comprising a Group 3-5 nitride semiconductor on a substrate of sapphire or the like is well known, when a substrate made of a material different from a Group 3-5 nitride semiconductor, sapphire or the like, is used, the substrate and the Group 3-5 nitride semiconductor are different in lattice constant or thermal expansion coefficient from each other, and thus there is such a problem that a high-density dislocation occurs after the Group 3-5 nitride semiconductor has been epitaxially grown, or that warpage occurs on the substrate, and in the worst case, it causes a crack. For this reason, a double-hetero structure Group 3-5 nitride semiconductor having an n-type Group 3-5 nitride semiconductor layer, a Group 3-5 nitride semiconductor layer as an active layer, and a p-type Group 3-5 nitride semiconductor layer on a free-standing substrate of a Group 3-5 nitride semiconductor is proposed. It is disclosed that this semiconductor is grown on the free-standing substrate of a Group 3-5 nitride semiconductor having low-dislocation densities, and thus it is excellent in crystallinity, and provides a light-emitting device wherein deterioration in emission properties is controlled (for example, JP-A-2000-223743). However, at this time, no bulk substrate made of a Group 3-5 nitride semiconductor can be industrially and inexpensively provided.

Accordingly, a method of obtaining a high-crystallinity substrate, comprising the step of once growing a Group 3-5 nitride semiconductor over a sapphire substrate, followed by selective growth over the Group 3-5 nitride semiconductor by using a $SiO_2$ mask, is proposed (for example, JP-A-2002-170778).

Further, a method of obtaining a Group 3-5 nitride semiconductor separated from a base substrate of sapphire or the like, comprising the step of growing the Group 3-5 nitride semiconductor over the base substrate, is proposed. For example, JP-A-2001-53056 discloses a method of separating a base substrate and a GaN layer from each other, comprising the steps of: once growing the GaN layer over the base substrate; forming $SiO_2$ stripes over the GaN layer; and regrowing an additional GaN-layer thereover; and thereafter partially etching the additional GaN-layer to the $SiO_2$ stripes to form a trench structure; further forming a GaN layer over the trench structure to planarize the surface of the GaN layer, followed by introducing an etching liquid into the trench structure to etch the $SiO_2$ stripes.

However, in order to form a GaN layer of a high-crystallinity Group 3-5 nitride semiconductor over the sapphire substrate according to the method disclosed in JP-A-2002-170778, the following steps are required, that is, the steps of: carrying out what is called two-step growth method which comprises forming a low-temperature buffer layer over the sapphire substrate, and forming a GaN layer thereover at a high temperature of 1000° C. or more; once unloading the Group 3-5 nitride semiconductor multilayer substrate from a semiconductor-crystal growing apparatus; forming the $SiO_2$-stripes mask over the Group 3-5 nitride semiconductor layer; reloading it into the semiconductor-crystal growing apparatus, followed by forming a Group 3-5 nitride semiconductor at a high temperature of 1000° C. or more. Thus, the method disclosed in JP-A-2002-170778 needs to carry out the crystal growth which requires a high temperature of 1000° C. or more for many hours two times.

On the other hand, in order to obtain the Group 3-5 nitride semiconductor substrate according to the method disclosed in JP-A-2001-53056, the following steps are required, that is, the steps of: processing the trench structure by using photolithography which needs steps such as resist exposure; and further carrying out the GaN crystal growth at a high temperature of 1000° C. or more for many hours over three times.

Thus each of JP-A-2002-170778 and JP-A-2001-53056 has the problem that it needs a long processing time at high production cost. Accordingly, a high-performance Group 3-5 nitride semiconductor light-emitting device could not be produced at a low price.

DISCLOSURE OF INVENTION

It is an object of the present invention to provide a Group 3-5 nitride semiconductor multilayer substrate, a method of producing a Group 3-5 nitride semiconductor free-standing substrate, and a semiconductor device, which can dissolve the above-mentioned problems in the prior art.

In order to dissolve the above-mentioned problems, the present inventors have devoted themselves to study a method of producing a Group 3-5 nitride semiconductor multilayer substrate (which will be abbreviated to "Group 3-5 nitride semiconductor multilayer substrate") comprising a high-quality Group 3-5 nitride semiconductor laminated over a substrate (which will be hereinafter referred to as "base substrate") for growing a Group 3-5 nitride semiconductor. As a result, it has been found that first of all, a low-crystalline layer is formed over a base substrate, and then a thin film of an inorganic material is formed upon the low-crystalline layer, followed by the formation of a Group 3-5 nitride semiconductor thereover, whereby a high-quality Group 3-5 nitride semiconductor layer is easily provided as well as the Group 3-5 nitride semiconductor layer is easily delaminated from the base substrate, and thus the present invention has been accomplished.

According to one aspect, the present invention provides a Group 3-5 nitride semiconductor multilayer substrate comprising: a base substrate; a semiconductor layer with which the base substrate is coated; a mask with which a portion of an upper surface of the semiconductor layer is coated; and a Group 3-5 nitride semiconductor crystalline layer with which both an exposed surface of the upper surface of the semiconductor layer, which is not coated with the mask, and the mask are coated, wherein the semiconductor layer is lower in crystallinity than the Group 3-5 nitride semiconductor crystalline layer.

Preferably voids are included within the semiconductor layer.

Preferably the mask is in the form of stripes or dots, or the unmasked portion is in the form of dots.

Preferably the mask comprises at least one material selected from the group consisting of $SiO_2$, $TiO_2$, $ZrO_2$, $CrO_2$, W, Re, Mo, Cr, Co, Si, Au, Zr, Ta, Ti, Nb, Ni, Pt, V, Hf, Pd, BN, W-nitride, Re-nitride, Mo-nitride, Cr-nitride, Si-nitride, Zr-nitride, Ta-nitride, Ti-nitride, Nb-nitride, V-nitride, Hf-nitride and Fe-nitride.

Preferably the semiconductor layer is a buffer layer of a material having the general formula: $In_xGa_yAl_zN$ wherein $0 \leq x \leq 1$, $0 \leq y \leq 1$, $0 \leq z \leq 1$ and $x+y+z=1$, the buffer layer being grown at a temperature of 400° C. to 700° C.

According to another aspect, the present invention provides a method of producing a Group 3-5 nitride semiconductor free-standing substrate comprising the steps of: forming a semiconductor layer over a base substrate; forming a mask over a portion of an upper surface of the semiconductor layer; forming a Group 3-5 nitride semiconductor crystalline layer by selective growth such that both an exposed surface of the upper surface of the semiconductor layer, which is not coated with the mask, and the mask are coated with the Group 3-5 nitride semiconductor crystalline layer; and separating the Group 3-5 nitride semiconductor crystalline layer and the base substrate from each other, wherein the semiconductor layer is lower in crystallinity than the Group 3-5 nitride semiconductor crystalline layer.

Preferably the step of separating comprises the step of mechanically delaminating the base substrate from the Group 3-5 nitride semiconductor crystalline layer by the application of stress.

It is preferred to further comprise the step of chemically etching at least one of the mask and the semiconductor layer after the step of separating.

Preferably the step of separating comprises the step of delaminating the base substrate from the Group 3-5 nitride semiconductor crystalline layer by lowering atmosphere temperature.

According to another aspect, the present invention provides a Group 3-5 nitride semiconductor free-standing substrate produced according to any one of the methods mentioned above.

According to another aspect, the present invention provides a semiconductor device comprising any one of the Group 3-5 nitride semiconductor multilayer substrates mentioned above.

According to another aspect, the present invention provides a semiconductor device comprising the Group 3-5 nitride semiconductor free-standing substrate mentioned above.

According to the present invention, a high-quality Group 3-5 nitride semiconductor multilayer substrate, a Group 3-5 nitride semiconductor free-standing substrate, and a high-performance semiconductor device can be easily provided without necessitating involved process.

MODE FOR CARRYING OUT THE INVENTION

Hereinafter, one example of embodiments of the present invention will be explained in detail with reference to the drawings.

FIG. 1 is a cross-sectional view representing a multilayer substrate of a Group 3-5 nitride semiconductor according to one embodiment of the present invention. The Group 3-5 nitride semiconductor multilayer substrate (1) has a structure wherein a base substrate (11) comprising a material such as sapphire; a semiconductor layer (12); a mask (13); and a Group 3-5 nitride semiconductor crystalline layer (14) are laminated in this order. The mask (13) is provided for selectively growing the Group 3-5 nitride semiconductor crystalline layer (14) onto the base substrate (11), whereby a Group 3-5 nitride semiconductor excellent in crystallinity can be formed on the base substrate (11). The wording "selectively growing" means that a mask is formed on a portion of the substrate, and a crystal is selectively grown on an exposed surface of the substrate, which is not coated with the mask.

In the present embodiment, the mask (13) may be a striped mask wherein multiple strip bodies extends in parallel with each other in a predetermined direction at proper intervals, the form of the mask (13) is not limited thereto. For example, a dotted mask, or a mask having a form wherein non-masked portions are dotted may be used. Additionally, as a material for the mask (13), a material on which the Group 3-5 nitride semiconductor can not be grown, or is difficult to be grown is preferred. Specific materials will be described hereinafter.

For the purpose of improving the crystallinity of the Group 3-5 nitride semiconductor crystalline layer (14) formed by selective growth using the mask (13) provided on the base substrate (11) as well as separating the Group 3-5 nitride semiconductor crystalline layer (14) from the Group 3-5 nitride semiconductor multilayer substrate (1) as shown FIG. 1 to obtain a Group 3-5 nitride semiconductor free-standing substrate including a Group 3-5 nitride semiconductor crystal (4) as a main constituent, the semiconductor layer (12) is provided. The semiconductor layer (12) is formed such that it is in a level lower in crystallinity than the Group 3-5 nitride semiconductor crystalline layer (14). Here, the semiconductor layer (12) is provided as a buffer layer.

Due to the low crystallinity of the semiconductor layer (12), many voids (12A) generated by heating in the step of forming the Group 3-5 nitride semiconductor crystalline layer (14) are formed within the semiconductor layer (12). These voids (12A) tend to frequently occur in a region sandwiched between the mask (13) and the base substrate (11).

The composition of the semiconductor layer (12) may be substantially the same as that of the Group 3-5 nitride semiconductor crystalline layer (14). The wording "substantially the same" means that the layers (12, 14) may be different from each other in the type and concentration of dopant.

The material of the semiconductor layer (12) (which may be referred to as "low-crystalline semiconductor layer (12)") provided toward this end preferably has a general formula: $In_xGa_yAl_zN$, wherein $0 \leq x \leq 1$, $0 \leq y \leq 1$, $0 \leq z \leq 1$ and $x+y+z=1$ so that the semiconductor layer (12) can sufficiently carry out its required function. Further, the growth temperature is preferably in the range of 400° C. to 700° C. That is, the low-crystalline semiconductor layer (12) is preferably formed as a low-temperature buffer layer.

This void (12A) lowers the mechanical strength of the low-crystalline semiconductor layer (12), and thus some kind of good ways is devised in order to provide a small strain force for the low-crystalline semiconductor layer (12), whereby the base substrate (11) and the Group 3-5 nitride semiconductor crystalline layer (14) are easily separated, and thus the Group 3-5 nitride semiconductor free-standing substrate mainly comprising the Group 3-5 nitride semiconductor crystalline layer (14) can be easily provided.

A semiconductor layer (15) made of a Group 3-5 nitride semiconductor, which has the function of a light-emitting device having a publicly known constitution, is further formed on the surface (14A) of the Group 3-5 nitride semiconductor crystalline layer (14), whereby the Group 3-5 nitride semiconductor multilayer substrate (1) forms a substrate for a Group 3-5 nitride semiconductor light-emitting device. This semiconductor layer (15) having a light-emitting device function can have a structure wherein an emission layer is sandwiched by a p-type layer and an n-type layer, what is called a double-hetero structure.

FIG. 2 is a cross-sectional view of a semiconductor light-emitting device according to one embodiment of the present invention. This semiconductor light-emitting device can be made from the Group 3-5 nitride semiconductor multilayer substrate (1) as shown in FIG. 1. The base substrate (11) is separated and removed from the Group 3-5 nitride semiconductor multilayer substrate (1) as shown in FIG. 1. If necessary, the semiconductor layer (12) and the mask (13) are chemically or physically removed. An electrode (16) is formed on the surface of the Group 3-5 nitride semiconductor crystalline layer (14), and an electrode (17) is formed on the surface of the semiconductor layer (15). In addition, the Group 3-5 nitride semiconductor crystalline layer (14) has an n-type conductivity in FIG. 2.

Now referring to FIG. 3, a method of making the Group 3-5 nitride semiconductor multilayer substrate as shown in FIG. 1, and a method of making the Group 3-5 nitride semiconductor free-standing substrate according to one embodiment of the present invention will be explained.

As methods of epitaxially growing the Group 3-5 nitride semiconductor crystalline layer (14), and as methods of epitaxially growing the semiconductor layer (12), various publicly known methods can be enumerated. For example, a hydride vapor phase epitaxy method (HVPE method), a molecular beam epitaxy (MBE method) or a metalorganic vapour phase epitaxy method (MOVPE method) may be independently used, or any one of these growth methods may be properly used for each layer of multiple semiconductor layers on a single multilayer substrate. The following description explains about the case wherein an MOVPE method and an HVPE method are employed, but
epitaxial growth methods for Group 3-5 nitride semiconductors used in the present invention are not limited thereto.

First of all, as shown in FIG. 3(a), a base substrate (11) is prepared. Preferably the base substrate (11) is stable under growth conditions for obtaining a high-quality Group 3-5 nitride semiconductor. Specifically, sapphire, SiC, Si or the like can be used as the base substrate (11). Particularly, sapphire causes cracks less frequently than SiC or Si due to stress after the crystal growth of the compound semiconductor, and thus sapphire can be suitably used in the present invention.

Now, as shown in FIG. 3(b), a low-crystalline semiconductor layer (12) is grown on the base substrate (11). Here, the low-crystalline semiconductor layer (12) is a buffer layer made of a Group 3-5 nitride semiconductor. The low-crystalline semiconductor layer (12) is preferably a low-temperature buffer layer made of a material having a formula: $In_xGa_yAl_zN$, wherein $0 \leq x \leq 1$, $0 \leq y \leq 1$, $0 \leq z \leq 1$ and $x+y+z=1$. In this case, when the film thickness of the low-crystalline semiconductor layer (12) is excessively thin, the crystals serving as nuclei for crystal growth are evaporated in a step after the step wherein a Group 3-5 nitride semiconductor crystalline layer (14) is formed at a high temperature, and thus the crystal quality of the Group 3-5 nitride semiconductor crystalline layer (14) will be lowered. On the other hand, when the film thickness of the low-crystalline semiconductor layer (12) is excessively thick, the crystals serving as nuclei for crystal growth are increased, and thus the crystal quality of the Group 3-5 nitride semiconductor crystalline layer (14) will be lowered. Accordingly, preferably the film thickness of the low-crystalline semiconductor layer (12) is 1 nm or more and 200 nm or less, more preferably 10 nm or more and 100 nm or less, and still more preferably 10 nm or more and 50 nm or less. In order to provide low crystallizabilities for the low-crystalline semiconductor layer (12), preferably the growth temperature of the low-crystalline semiconductor layer (12) is in the range of 400° C. to 700° C., and more preferably 450° C. to 600° C.

After the low-crystalline semiconductor layer (12) was formed, a mask (13) is formed on the low-crystalline semiconductor layer (12) (see FIG. 3(c)). As a material for the mask (13), a material on which the Group 3-5 nitride semiconductor can not grow, or is difficult to grow is preferred. For example, preferably the material is at least one material selected from the group consisting of $SiO_2$, $TiO_2$, $ZrO_2$, $CrO_2$, W, Re, Mo, Cr, Co, Si, Au, Zr, Ta, Ti, Nb, Ni, Pt, V, Hf, Pd, BN, W-nitride, Re-nitride, Mo-nitride, Cr-nitride, Si-nitride, Zr-nitride, Ta-nitride, Ti-nitride, Nb-nitride, V-nitride, Hf-nitride and Fe-nitride. When a metal such as W and Ti is used as the mask, an interface between the mask and a Group 3-5 nitride semiconductor crystal over the mask is exposed to an etching action with hydrogen or ammonium, and thereby voids can be formed within the interface, whereby the resultant semiconductor crystal may be easily delaminated.

The shape of the mask (13) may be in any appropriate shape, such as a stripe shape, a dotted shape, or a shape wherein an unmasked portion has a dotted shape, or in a shape in combination with each other. When a metal such as W or Ti is used as the mask, the material may be etched with $H_2$ or $NH_3$ such that the low-crystalline semiconductor layer (12) is partially exposed, and the whole surface of the substrate can be coated with the mask.

When a stripe mask is used, preferably the width of the stripe is 0.1 μm or more and 50 μm or less, more preferably 1 μm or more and 30 μm or less, further preferably 1 μm or more and 20 μm or less, and still more preferably 1 μm or more and 10 μm or less. When the width of the stripe is excessively wide, it becomes difficult to embed the unmasked portions with a crystal, while when excessively narrow, a high-quality crystal is difficult to be provided. In addition, preferably the interval between the stripes is 0.1 μm or more and 50 μm or less, more preferably 1 μm or more and 20 μm or less, further preferably 1 μm or more and 10 μm or less.

When the base substrate (11) is made of C(0001)-surface sapphire, the direction of the stripe of the mask (13) may be parallel to a <1-100> direction or a <11-20> direction, or may be slightly inclined therefrom. When the direction is inclined, preferably the angle of inclination is 0.095° or more and less than 9.6°.

When a dotted mask is used, the shape of the dotted mask may be any one of polygons such as circles, triangles, quadrangles or hexagons, or may be a combination of these polygons. In these cases, the diameter of the mask (when its shape is a polygon, the diameter corresponds to that of a circle having the same area as the area of the polygon) is preferably 0.1 μm or more and 50 μm or less, more preferably 1 μm or more and 30 μm or less, further preferably 1 μm or more and 20 μm or less, and still more preferably 1 μm or more and 10 μm or less. When the mask diameter is excessively large, it becomes difficult to embed the unmasked portions with a crystal, while when the mask diameter is excessively small, it becomes difficult to provide a high-quality crystal. Besides, the mask interval is preferably 0.1 μm or more and 50 μm or less, more preferably 1 μm or more and 20 μm or less, further preferably 1 μm or more and 10 μm or less.

When a dotted mask is used, and the base substrate (11) is C(0001)-surface sapphire, the direction of a side of the dot may be parallel to a <1-100> direction or a <11-20> direction, or may be slightly inclined therefrom. When the direction is inclined, preferably the angle of inclination is 0.095° or more and less than 9.6°.

When the unmasked portion is having dotted shapes, the dotted shape of the unmasked portion may be any one of polygons such as circles, triangles, quadrangles or hexagons, or may be a combination of these polygons. The diameter of the unmasked portion (when its shape is a polygon, the diameter corresponds to that of a circle having the same area as the area of the polygon) is preferably 0.1 μm or more and 50 μm or less, more preferably 1 μm or more and 30 μm or less, further preferably 1 μm or more and 20 μm or less, and still more preferably 1 μm or more and 10 μm or less. When the mask diameter is excessively large, it becomes difficult to embed the unmasked portions with a crystal, while when the mask diameter is excessively small, it becomes difficult to provide a high-quality crystal. Besides, the mask interval is preferably 0.1 μm or more and 50 μm or less, more preferably 1 μm or more and 20 μm or less, further preferably 1 μm or more and 10 μm or less.

The mask can be formed by photo-lithography well-known in the field of semiconductor manufacturing. A surface which is not coated with the mask (13) and a low-crystalline semiconductor layer (12) is exposed to forms a growth region (O) on which a Group 3-5 nitride semiconductor crystal is grown (see FIG. 3(c)).

Next, a Group 3-5 nitride semiconductor is epitaxially grown on the growth region (Q). First of all, a Group 3-5 nitride semiconductor is grown on the surface on which the mask (13) is not coated and the low-crystalline semiconductor layer (12) is exposed, while a facet structure (14D) is formed (see FIG. 3(d)). Then this facet structure (14D) is embedded with a Group 3-5 nitride semiconductor, whose surface is planarized, and a crystal is grown on the Group 3-5 nitride semiconductor, whereby a Group 3-5 nitride semiconductor crystalline layer (14) is formed (see FIG. 3(e)).

The steps as shown in FIGS. 3(d) and (e) will be more particularly explained. The low-crystalline semiconductor layer (12) is formed from a layer having a formula: $In_xGa_yAl_zN$, wherein $0 \leq x \leq 1$, $0 \leq y \leq 1$, $0 \leq z \leq 1$ and $x+y+z=1$. When the low-crystalline semiconductor layer (12) includes AlN, it is difficult to be decomposed, and thus preferably the low-crystalline semiconductor layer (12) is GaN and/or InGaN. When the semiconductor layer (12) is grown at a low temperature, the resultant semiconductor layer (12) is low in crystallinity. Therefore, the semiconductor layer (12) under the mask (13) is etched with hydrogen or ammonium, which forms a crystallization atmosphere or growth atmosphere, and thus voids (12A) are formed in a region between the mask (13) and the base substrate (11) within the low-crystalline semiconductor layer (12). The crystallinity of the semiconductor layer (12) can be estimated by, for example, peak heights and full width at half maximums in an X-ray crystal structure analysis.

When the mask (13) is disposed on the low-crystalline semiconductor layer (12), and thereafter a material gas and the like are supplied onto the low-crystalline semiconductor layer (12) according to an epitaxial growth method for a 3-5 nitride semiconductor, a 3-5 nitride semiconductor is grown from the growth region (Q) (see FIG. 3(d)), and the 3-5 nitride semiconductor is grown on the low-crystalline semiconductor layer (12) such that the disposed mask (13) is embedded. The 3-5 nitride semiconductor is further grown such that almost all of the mask (13) is embedded in the 3-5 nitride semiconductor. Then, after the mask (13) has been embedded in the 3-5 nitride semiconductor, the 3-5 nitride semiconductor is epitaxially further grown thereupon, whereby the Group 3-5 nitride semiconductor crystalline layer (14) having a required film thickness is formed (see FIG. 3(e)).

Thus a method of making a Group 3-5 nitride semiconductor crystalline layer (14), comprising the steps of: growing a Group 3-5 nitride semiconductor while forming a facet structure on low-crystalline semiconductor layer (12) on which a mask (13) is disposed, and then growing a nitride semiconductor in which the facet structure is embedded and whose surface is planarized, to form the Group 3-5 nitride semiconductor crystalline layer (14) is preferred. The reason is as follows:

When the mask (13) is disposed on the low-crystalline semiconductor layer (12), and then such a growth as the facet structure is formed on the growth region (Q) is carried out, and thereafter the Group 3-5 nitride semiconductor is grown such that the facet structure is embedded by enhancing lateral growth and the crystal is planarized (see FIG. 3(e)), the mask (13) can be embedded and included within the Group 3-5 nitride semiconductor crystalline layer (14), because a dislocation which has reached facets is bended in a transverse direction. In this instance, crystal defects can be drastically decreased. Furthermore, when such a growth as the facet structure is embedded is carried out, a void portion may be generated in the region over the mask (13) within the Group 3-5 nitride semiconductor crystalline layer (14). Because the dislocation which has reached facets is bended in a transverse direction, and the dislocation can be terminated at the void portion, a high-quality crystal can be provided.

Next, the separation step of separating the Group 3-5 nitride semiconductor crystalline layer (14) and the base substrate (11) will be explained (see FIG. 3(f)).

The step of bonding the Group 3-5 nitride semiconductor crystalline layer (14) to a supporting substrate (not shown) may be provided prior to the step of separating the base substrate (11). In this case, as the supporting substrate, a publicly known thin film, for example, a metallic thin film, and a resin film such as a polymer, can be used. A metal substrate can be laminated by using a low-temperature alloy according to a publicly known method. Furthermore, when a resin film is used as supporting substrate, a thermosetting resin or a photosetting resin can be used.

When the Group 3-5 nitride semiconductor crystalline layer (14) is grown on the low-crystalline semiconductor layer (12) coating the base substrate (11) and on the mask (13), portions of the low-crystalline semiconductor layer (12), which are not coated with the mask (13), are etched when the Group 3-5 nitride semiconductor crystalline layer (14) is grown. Therefore, the base substrate (11) and the Group 3-5 nitride semiconductor crystalline layer (14) are weakly connected with each other. For this reason, when the thickness of the Group 3-5 nitride semiconductor crystalline layer (14) is sufficiently increased, the internal stress and the external stress becomes easily and intensively to act to the region between the base substrate (11) and the Group 3-5 nitride semiconductor crystalline layer (14), causing this weak connection. As a result, in particular, these stresses act as a shear stress or the like to the region. When this stress is increased, the connection portion between the base substrate (11) and the Group 3-5 nitride semiconductor crystalline layer (14) is fractured, the both are separated from each other. Thus the fracture between the base substrate (11) and the Group 3-5 nitride semiconductor crystalline layer (14) specifically occurs in a boundary region between the base substrate (11) and the low-crystalline semiconductor layer (12), a boundary region between the low-crystalline semiconductor layer (12) and the mask (13), a boundary region between the low-crystalline semiconductor layer (12) and the Group 3-5 nitride semiconductor crystalline layer (14), or a boundary region between the mask (13) and the Group 3-5 nitride semiconductor crystalline layer (14), or multiple boundary regions of these boundary regions.

As another method of separating the Group 3-5 nitride semiconductor crystalline layer (14) and the base substrate (11), a method of mechanically separating the same by applying stress can be enumerated. The stress may be internal stress or external stress. Specifically, a method of applying internal stress and/or external stress to a region between the base substrate (11) and the Group 3-5 nitride semiconductor crystalline layer (14) can be enumerated. The internal stress and/or the external stress are applied to the region, and thereby the base substrate (11) and the Group 3-5 nitride semiconductor crystalline layer (14) can be easily separated (or delaminated).

As a method comprising using internal stress, a method of spontaneously delaminating the base substrate (11) by utilizing a stress based upon the difference in thermal expansion coefficient between the Group 3-5 nitride semiconductor crystalline layer (14) and the base substrate (11) can be enumerated. Specifically, the method can use the step of: cooling them from the growth temperature of the Group 3-5 nitride semiconductor crystalline layer (14) to room temperature; cooling them from room temperature by using a low-temperature medium such as liquid nitrogen; or reheating them from room temperature, followed by cooling them by using a low-temperature medium such as liquid nitrogen.

As a method comprising using external stress, a method comprising the steps of: fixing one of the Group 3-5 nitride semiconductor crystalline layer (14) and the base substrate (11), and applying a mechanical impact to the other can be enumerated.

According to the above-mentioned methods, the Group 3-5 nitride semiconductor crystal mainly comprising the Group 3-5 nitride semiconductor crystalline layer (14) independent from the base substrate (11) can be provided a Group 3-5 nitride semiconductor free-standing substrate.

The underside surface of the Group 3-5 nitride semiconductor crystalline layer (14) separated from the base substrate (11) includes the mask (13), and thus the mask (13) may be removed for use by chemical processing treatment such as etching, or physical processing treatment such as grinding or plishing. For example, an oxide such as $SiO_2$ can be removed with an acid. In this case, channels or through-holes may be previously provided for the base substrate (11) so that an etching liquid such as an acid can easily reach the mask (13) material. After the Group 3-5 nitride semiconductor crystalline layer (14) has been formed, the through-holes or channels may be provided from the surface of the Group 3-5 nitride semiconductor crystalline layer (14). Furthermore, radiation rays such as laser may be made absorbed in an interface between the base substrate (11) and the low-crystalline semiconductor layer (12), partially to decompose the low-crystalline semiconductor layer (12) to facilitate the delamination between the low-crystalline semiconductor layer (12) and the base substrate (11).

As a method of epitaxially growing the Group 3-5 nitride semiconductor crystalline layer (14), an MOVPE method, an HVPE method, an MBE method and the like can be enumerated. When the low-crystalline semiconductor layer (12) or the Group 3-5 nitride semiconductor crystalline layer (14) is grown using the MOVPE method, the following compounds can be used as a starting material.

As Group 3 materials, for example, trialkylgallium represented by the general formula: $R_1R_2R_3Ga$ (wherein each of $R_1$, $R_2$, $R_3$ is independently the same as the others or different from the others, and represents a lower alkyl group), such as trimethylgallium [$(CH_3)_3Ga$, which may be hereinafter described as "TMG"] or triethylgallium [$(C_2H_5)_3Ga$, which may be hereinafter described as "TEG"]; trialkylaluminum represented by the general formula: $R_1R_2R_3Al$ (wherein each of $R_1$, $R_2$, $R_3$ is independently the same as the others or different from the others, and represents a lower alkyl group), such as trimethylaluminum [$(CH_3)_3Al$, which may be hereinafter described as "TMA"], triethylaluminum [$(C_2H_5)_3Al$, which may be hereinafter described as "TEA"] or triisobutylaluminum [$(i-C_4H_9)_3Al$]; trimethylaminealane [$(CH_3)_3N:AlH_3$]; trialkylindium represented by the general formula: $R_1R_2R_3In$ (wherein each of $R_1$, $R_2$, $R_3$ is independently the same as the others or different from the others, and represents a lower alkyl group), such as trimethylindium [$(CH_3)_3In$, which may be hereinafter described as "TMI"] or triethylindium [$(C_2H_5)_3In$]; a material produced by replacing one or two alkyl groups in trialkylindium with one or two halogen atoms, respectively, such as diethylindium chloride [$(C_2H_5)_2InCl$]; an indium halide represented by the general formula: InX (wherein X is a halogen atom), such as indium chloride; and the like can be enumerated. These may be used independently or as a mixture thereof. In these Group 3 materials, a gallium source is preferably TMG, an aluminum source is preferably TMA, and an indium source is preferably TMI.

As Group 5 materials, for example, ammonia, hydrazine, methylhydrazine, 1,1-dimethylhydrazine, 1,2-dimethylhydrazine, t-butylamine, ethylenediamine, and the like can be enumerated. These may be used independently or as a mixture in any combination thereof. Since among these materials, ammonia and hydrazine include no carbon atoms in their molecules, the contamination of the semiconductor by carbon is small. Thus ammonia and hydrazine are preferred. From the viewpoint of the ready availability of high-purity products, ammonia is more preferred.

In the MOVPE method, as an atmosphere gas during growth and as a carrier gas for organometallic materials, gases such as nitrogen, hydrogen, argon and helium can be used independently or as a mixture thereof. Among others, hydrogen and helium are preferred.

The above-mentioned material gases are introduced into a reactor, followed by the growth of a nitride semiconductor. The reactor comprises a material supplying line for supplying material gases from a material supplying system to the reactor, with a susceptor for heating a substrate within the reactor. The susceptor has a structure which can be generally rotated by rotator in order to uniformly grow a nitride semiconductor layer. A heating apparatus to heat the susceptor, such as an infrared ray lamp, is provided within the susceptor. The material gases supplied into the reactor through the material supplying line is pyrolized on a growth substrate by this heating so that a desired compound can be vapor-phase grown on the substrate. Unreacted material gases of the material gases supplied into the reactor are exhausted out of the reactor through an exhaust line, followed by the delivery to an exhaust-gas treatment equipment.

Furthermore, when a nitride semiconductor layer is grown according to a HVPE method, the following compounds can be used as starting materials.

As Group 3 materials, gallium chloride gas, which is produced by reacting gallium metal with hydrogen chloride gas; indium chloride gas, which is produced by reacting indium metal with hydrogen chloride gas; and the like can be enumerated. As a Group 5 material, ammonia can be enumerated. As a carrier gas, a gas such as nitrogen gas, hydrogen gas or helium gas can be used independently or as a mixture thereof. Among others, hydrogen gas and helium gas are preferred. The above-mentioned material gas is introduced into a reactor, followed by the growth of a nitride semiconductor.

Besides, when a nitride semiconductor layer is grown according to a MBE method, the following compounds can be used as starting materials.

As Group 3 materials, metal such as gallium, aluminum or indium can be enumerated. As Group 5 materials, a gas such as nitrogen or ammonia can be enumerated. As a carrier gas, a gas such as nitrogen gas, hydrogen gas, argon gas or helium gas can be used independently or as a mixture thereof. Among others, hydrogen gas and helium gas are preferred. The above-mentioned material gas is introduced into a reactor, followed by the growth of a nitride semiconductor.

After the step shown in FIG. 3 (e) has been finished, another Group 3-5 nitride semiconductor layer may be formed over the Group 3-5 nitride semiconductor crystalline layer (14). In this case, a mask is further disposed over the Group 3-5 nitride semiconductor crystalline layer (14), and further a facet structure is formed, and then the facet structure is embedded, followed by the planarization of the Group 3-5 nitride semiconductor layer. Even in this case, a dislocation reached the facet is bended in a lateral direction, and thus the mask can be embedded and included within the nitride semiconductor layer. Then crystal defects can be drastically decreased. The Group 3-5 nitride semiconductor layer can be undoped or doped with impurities.

This Group 3-5 nitride semiconductor may be grown according to a MOVPE method or a HVPE method. When the Group 3-5 nitride semiconductor layer is delaminated by stress, the total film thickness of the Group 3-5 nitride semiconductor layer is 3 µm or more and 500 µm or less, preferably 10 µm or more and 400 µm or less, more preferably 10 µm or more and 65 µm or less, further preferably 10 µm or more and 45 µm or less. When the film thickness is increased, the dislocation density tends to be decreased. However, when the thickness of the lamination is increased, manufacturing costs become that much higher, and thus the excessive thickness is not preferred. The Group 3-5 nitride semiconductor multilayer substrate may be unloaded from the reactor after cooling, and separated from the base substrate, and thereafter reloaded into the reactor in order to form an n-type contact layer, an emission layer and a p-type layer.

Otherwise an n-type contact layer, an emission layer and a p-type layer may be continuously formed over the Group 3-5 nitride semiconductor multilayer substrate wherein the Group 3-5 nitride semiconductor is formed at a predetermined thickness. Thereafter, the epitaxial substrate is unloaded from the reactor, and the substrate is removed, an electrode is formed upon the resultant nitride semiconductor substrate by publicly known means to form a light-emitting device.

In order not to increase the operating voltage of the light-emitting device, the n-type carrier density of the n-type contact layer is preferably $1 \times 10^{18}$ cm$^{-3}$ or more and $1 \times 10^{19}$ cm$^{-3}$ or less. When the crystal having the general formula: In$_x$Ga$_y$Al$_z$N, wherein $0 \leq x \leq 1$, $0 \leq y \leq 1$, $0 \leq z \leq 1$ and x+y+z=1, is grown at a growth temperature of 850° C. to 1100° C., this n-type contact layer can be easily provided by a publicly known method which comprises incorporating an n-type dopant gas, or an organometallic material into the InGaAlN-material in an appropriate amount. As the n-type dopant gas, silane, disilane, germane, tetramethylgermanium, and the like are preferred.

In addition, when the mole fraction of In or Al is high, in particular at a low temperature, the crystal quality is decreased, and the carrier density is increased. Therefore, the In content is preferably 5% or less, and more preferably 1% or less, while the Al content is preferably 5% or less, and more preferably 1% or less. The n-type contact layer most preferably comprises GaN.

A Group 3-5 nitride semiconductor layer of a material represented by the general formula: In$_a$Ga$_b$Al$_c$N, wherein a+b+c=1, $0 \leq a \leq 1$, $0 \leq b \leq 1$, $0 \leq c \leq 1$, may be provided between the n-type contact layer and the light-emitting layer. The Group 3-5 nitride semiconductor may have a multi-layer structure wherein each layer is different in composition and carrier density from the others.

The light-emitting layer is formed over the n-type contact layer. The light-emitting layer has a multiquantum well structure comprising a barrier layer of a material having the general formula: In$_a$Ga$_b$Al$_c$N wherein a+b+c=1, $0 \leq a \leq 1$, $0 \leq b \leq 1$, $0 \leq c \leq 1$, and a well layer of a material having the general formula: In$_a$Ga$_b$Al$_c$N wherein a+b+c=1, $0 \leq a \leq 1$, $0 \leq b \leq 1$, $0 \leq c \leq 1$. The well layer may have a multi-layer, or may have at least one layer.

A layer of a material having the general formula: In$_a$Ga$_b$Al$_c$N, wherein a+b+c=1, $0 \leq a \leq 1$, $0 \leq b \leq 1$, $0 \leq c \leq 1$, can be provided between the light-emitting layer and the after-mentioned p-type contact layer. The layer is preferably an AlGaN-layer. The AlGaN-layer may be p-type or n-type. When it is n-type, the carrier density is preferably $1 \times 10^{18}$ cm$^{-3}$ or less, more preferably $1 \times 10^{17}$ cm$^{-3}$ or less, and further preferably $1 \times 10^{16}$ cm$^{-3}$ or less. In order to decrease the n-type carrier density of the AlGaN-layer, Ma is doped. Incidentally, a layer of a material represented by the general formula: In$_d$Ga$_e$Al$_f$N, wherein $0 \leq d \leq 1$, $0 \leq e \leq 1$, $0 \leq f \leq 1$, d+e+f=1, the space-charge density of the layer being lower than that of the AlGaN-layer, may be provided between the p-type contact layer and the AlGaN-layer.

The p-type contact layer is formed over the AlGaN-layer. In order not to increase the operating voltage of the light-emitting device, the p-type carrier density of the p-type contact layer is preferably $5 \times 10^{15}$ cm$^{-3}$ or more, and more preferably in the range of $1 \times 10^{16}$ cm$^{-3}$ to $5 \times 10^{19}$ cm$^{-3}$. When the crystal having the general formula: In$_a$Ga$_b$Al$_c$N, wherein a+b+c=1, $0 \leq a \leq 1$, $0 \leq b \leq 1$, $0 \leq c \leq 1$, is grown at a growth temperature of 800° C. to 1100° C., this p-type contact layer can be easily provided by a publicly known method which comprises incorporating a doping material gas into the InGaAlN-material in an appropriate amount so as to grow the crystal, followed by heat treatment.

In addition, when the mole fraction of Al is high, the contact resistance of the p-type contact layer tends to be increased. Therefore, the Al content is generally 5% or less, and preferably 1% or less. The p-type contact layer more preferably comprises GaAlN or GaN, and most preferably GaN.

When each layer mentioned above is grown using an MOVPE method, the following materials can be properly selected for use.

As Group 3 gallium materials, a trialkylgallium represented by the general formula: R$_1$R$_2$R$_3$Ga wherein each of R$_1$, R$_2$ and R$_3$ is independently the same as the others, or different from the others, and is a lower alkyl group, such as trimethylgallium (TMG) or triethylgallium (TEG), can be enumerated.

As aluminum materials, a trialkylaluminum represented by the general formula: $R_1R_2R_3Al$ wherein each of $R_1$, $R_2$ and $R_3$ is independently the same as the others, or different from the others, and is a lower alkyl group, such as trimethylaluminum (TMA), triethylaluminum (TEA), or triisobutylaluminum can be enumerated.

As indium materials, a trialkylindium represented by the general formula: $R_1R_2R_3In$ wherein each of $R_1$, $R_2$ and $R_3$ is independently the same as the others, or different from the others, and is a lower alkyl group, such as trimethylindium (TMI), triethylindium; a material produced by replacing one to three alkyl groups in trialkylindium with one to three halogen atoms, respectively, such as diethylindium chloride; an indium halide represented by the general formula: $InX$ (wherein X is a halogen atom), such as indium chloride; and the like can be enumerated.

As Group 5 materials, for example, ammonia, hydrazine, methylhydrazine, 1,1-dimethylhydrazine, 1,2-dimethylhydrazine, t-butylamine, ethylenediamine, and the like can be enumerated. These may be used independently or as a mixture in any combination thereof. Since among these materials, ammonia and hydrazine include no carbon atoms in their molecules, the contamination of the semiconductor by carbon is small. Thus ammonia and hydrazine are preferred.

As the p-type dopants, for example, Mg, Zn, Cd, Ca and Be can be enumerated. Among others, Mg and Ca are preferably used. As a material for Mg used as a p-type dopant, for example, bis(cyclopentadienyl)magnesium $[(C_5H_5)_2Mg]$, bis(methylcyclopentadienyl)magnesium $[(C_5H_4CH_3)_2Mg]$, bis(ethylcyclopentadienyl)magnesium $[(C_5H_4C_2H_5)_2Mg]$, or the like can be used. As a material for Ca, bis(cyclopentadienyl)calcium $[(C_5H_5)_2Ca]$, or the derivative thereof, for example, bis(methylcyclopentadienyl)calcium $[(C_5H_4CH_3)_2Ca]$, bis(ethylcyclopentadienyl)calcium $[(C_5H_4C_2H_5)_2Ca]$, or bis(perfluorocyclopentadienyl)calcium $[(C_5F_5)_2Ca]$; (di-1-naphthalenyl)calcium, or the derivative thereof; or calcium acetylide, or the derivative thereof, for example, bis(4,4-difluoro-3-buten-1-ynyl)calcium or bis(phenylethynyl)calcium; can be used. These materials may be used independently or as a mixture of two or more thereof.

Incidentally, although the above embodiment explains the case of using the MOVPE method, the present invention is not limited to this method, but can use any other publicly known method of growing Group 3-5 nitride semiconductor crystals, such as a hydride vapor phase epitaxy (HVPE) method or a molecular beam epitaxy (MBE) method.

The production method of the present invention is characterized by forming a mask over a low-crystalline semiconductor layer such as a low-temperature buffer. The mask is formed over the low-crystalline layer, a Group 3-5 nitride semiconductor is grown in a lateral direction, and grown such that the mask is embedded, whereby a low-dislocation and high-quality Group 3-5 nitride semiconductor crystal can be provided.

In addition, the low-crystalline semiconductor layer is etched with hydrogen or ammonia in atmosphere during the growth of the nitride semiconductor, so that the junction-strength of the interface of the low-crystalline semiconductor layer and the nitride semiconductor is decreased, and thus the Group 3-5 nitride semiconductor becomes to be easily delaminated from the substrate, whereby the Group 3-5 nitride semiconductor can be delaminated from the substrate by strain due to heat or mechanical stress.

Alternatively, radiation rays such as laser are absorbed in the interface of the base substrate and the Group 3-5 nitride semiconductor or the mask, whereby the base substrate and the nitride semiconductor are delaminated from each other.

As a result, a high-quality Group 3-5 nitride semiconductor substrate can be provided. Otherwise, when the base substrate and the nitride substrate are separated, the mask material or the low-crystalline layer may be chemically removed.

The above-mentioned Group 3-5 nitride semiconductor free-standing substrate, and a nitride semiconductor substrate wherein a layer having an emission function is formed with the free-standing substrate can be used as it is. However, in order to enhance heat radiation properties and/or stiffness, such substrates can be appropriately installed to a supporting member for use. Besides, the supporting member may be removed in the post-step.

For example, as shown in FIG. 9, the Group 3-5 nitride semiconductor free-standing substrate (19) may be installed on a metallic supporting substrate (18) having a required thickness by adhesion or other suitable means. Alternatively, a nitride semiconductor substrate including the Group 3-5 nitride semiconductor free-standing substrate (19) may be installed on the supporting substrate (18). Alternatively, as shown in FIG. 10, a nitride semiconductor substrate (21) may be applied to the concave portion of a semiconductor light-emitting device package (20) by adhesion or other suitable means.

When in this way a nitride semiconductor substrate of the present invention is directly applied to a semiconductor light-emitting device package with a high specific thermal conductivity, the linearity of a brightness-current line can be maintained to a high current density.

EXAMPLES

Hereinafter, the present invention will be further particularly explained based upon examples, but the present invention is intended not to be limited thereto.

Example 1

As described below, a Group 3-5 nitride semiconductor multilayer substrate (1) shown FIG. 1 was prepared. Sapphire whose C-surface had been mirror-polished was used as a base substrate (11). An MOVPE method was used for epitaxial growth. A carrier gas, ammonia and TMG were supplied into a growth chamber at 1 atm, while the temperature of a susceptor was maintained at 485° C., and hydrogen was used as the carrier gas, followed by the growth of a GaN-buffer layer (low-crystalline semiconductor layer (12)) having a thickness of about 60 nm.

Once the base substrate (11) was unloaded from the growth chamber, and $SiO_2$-stripes (here the stripe width was 5 μm; the stripe interval was 5 μm; and the stripes were in parallel with the <1-100> direction of the sapphire substrate) were formed with a film thickness of 80 nm as a mask (13) by means of optical lithography technologies. Then, the base substrate (11) over which the low-crystalline semiconductor layer (12) with mask (13) formed thereupon was formed was reset in the growth chamber.

Next, as described below, a Group 3-5 nitride semiconductor crystalline layer (14) was formed. First of all, pressure within a reactor was set to 500 Torr, and the temperature of a susceptor was set to 1120° C., and thereafter a carrier gas, ammonia and TMG were supplied into the reactor for 90 minutes at 4.0 slm, 4.0 slm and 35 sccm, respectively, so as to form an undoped GaN-layer. Further, the susceptor temperature was set to 1080° C. with pressure within the reactor maintained to 500 Torr, and thereafter a carrier gas, ammonia and TMG were supplied into the reactor for 360 minutes at 4.0 slm, 4.0 slm and 50 sccm, respectively, so as to form an undoped GaN-layer. Finally, the undoped GaN-layer was grown to the thickness of 35 μm to form the Group 3-5 nitride semiconductor crystalline layer (14).

Thereafter, the reactor temperature was lowered to room temperature, and the resultant product was unloaded from the reactor, whereby delamination was caused at the interface of the sapphire substrate which is the growth substrate (11), and the Group 3-5 nitride semiconductor crystalline layer (14), and thus a nitride semiconductor free-standing substrate (GaN single-crystal) separated from the sapphire substrate was obtained. The full width at half maximum of (0004) calculated from the X-ray diffraction was 165 arcsec under the condition of a horizontal slit width being 62.5 μm at the X-rays receiving side, when incoming X-rays were parallel to the $SiO_2$ stripes, while it was 189 arcsec when incoming X-rays were perpendicular to the $SiO_2$ stripes. Thus a high-crystallinity GaN free-standing substrate could be obtained.

Example 2

According to the same procedures as the ones in Example 1 except that $SiO_2$ stripes were set to the stripe width of 7 μm, the stripe interval of 3 μm, with the stripes being parallel to the <1-100> direction of a sapphire substrate, a GaN layer was grown over the sapphire substrate to the thickness of 35 μm to form a Group 3-5 nitride semiconductor crystal (14).

Thereafter, the reactor temperature was lowered to room temperature, and the resultant product was unloaded from the reactor, whereby delamination was caused at the interface of the sapphire substrate and the Group 3-5 nitride semiconductor crystal (14), and thus a nitride semiconductor substrate (GaN single-crystal) separated from the sapphire substrate was obtained. The full width at half maximum of (0004) calculated from the X-ray diffraction of the resultant GaN layer was 156 arcsec when incoming X-rays were parallel to the $SiO_2$ stripes, while it was 120 arcsec when incoming X-rays were perpendicular to the $SiO_2$ stripes. Thus a high-crystallinity GaN free-standing substrate could be obtained.

Example 3

According to the same procedures as the ones in Example 1 except that $SiO_2$ stripes were set to the stripe width of 3 μm, the stripe interval of 7 μm, with the stripes being parallel to the <1-100> direction of a sapphire substrate, a GaN layer was grown over the sapphire substrate to the thickness of 35 μm to form a Group 3-5 nitride semiconductor crystal (14).

Thereafter, the reactor temperature was lowered to room temperature, and the resultant product was unloaded from the reactor. The full width at half maximum of (0004) calculated from the X-ray diffraction of the resultant GaN layer was 184 arcsec when incoming X-rays were parallel to the $SiO_2$ stripes, while it was 125 arcsec when incoming X-rays were perpendicular to the $SiO_2$ stripes. Thus a high-crystallinity GaN free-standing substrate could be obtained.

Comparative Example 1

A GaN layer was grown to the thickness of 35 μm to form a Group 3-5 nitride semiconductor crystal (14) according to the same procedures as the ones in Example 1 except that $SiO_2$ stripes were not formed. The delamination of the GaN layer from a sapphire substrate was not observed. Then the full width at half maximum of (0004) calculated from the X-ray diffraction of the resultant GaN layer was 360 arcsec without relation to the incident direction of X-rays.

Example 4

Non-light emitting portions in each of samples obtained in Examples 1 to 3 and Comparative Example 1 were observed with an excitation peak wavelength of 364 nm, and GaN-crystal surface cathodoluminescence (which is abbreviated to "CL"). Non-light emitting portions were referred to "dark spots", which are considered to correspond to dislocation. Thus dislocation densities were calculated from the number of the non-light emitting portions. The result was summarized as follows:

| | Stripe Width/Interval | Dislocation density |
| --- | --- | --- |
| Example 1 | 5 μm/5 μm | 5 to 8 × $10^7$ $cm^{-2}$ |
| Example 2 | 7 μm/3 μm | 5 to 8 × $10^7$ $cm^{-2}$ |
| Example 3 | 3 μm/7 μm | 4 × $10^8$ $cm^{-2}$ |
| Comp. Ex. | None | >1 × $10^9$ $cm^{-2}$ |

Example 5

A GaN layer was grown to 35 μm over a sapphire substrate in a manner similar to Example 1. Then, in order to provide electron transport properties for the GaN layer, the GaN layer was doped with silane to form an Si-doped GaN layer. According to the following method, a light-emitting layer for blue LED was formed over this layer. First of all, the reactor temperature was lowered to 780° C., and nitrogen gas was used as a carrier gas, and thus GaN, (InGaN, GaN) were grown by repeating the procedures five times, and thereafter a Mg-doped AlGaN layer having Al of 0.05% was grown to a thickness of 25 nm. Then, the reactor temperature was increased to 1040° C., and a mixed gas of a carrier gas, ammonia, TMG and $Cp_2Mg$ was introduced into the reactor, followed by the formation of Mg-doped GaN layer having a thickness of 150 nm with a growth time of 30 minutes. Thereafter, the reactor temperature was lowered to room temperature, and the product was unloaded from the reactor, whereby delamination was caused at the interface of the growth substrate and the Mg-doped GaN layer, and thus a nitride semiconductor substrate separated from the growth substrate was obtained.

The Group 3-5 compound semiconductor substrate produced as described above was unloaded from the reactor, and annealed at a temperature of 800° C. in nitrogen for 20 minutes, whereby the Mg-doped GaN layer was transformed into a low-resistance p-type layer. On each of the resultant samples, electrodes were formed in the usual manner so as to form a light-emitting diode (LED). A Ni—Au alloy was used as a p-type electrode, and Al was used as an n-type electrode.

When voltage was applied to the resultant light-emitting device, and the light-emitting property of the light-emitting device in the form of wafer was examined, it showed clear and blue emission-light.

Reference Example 1

An undoped GaN-layer was formed according to the same procedures as the ones in Example 1 with respect to the steps of growing a buffer layer, forming stripes, growing an undoped GaN-layer at a temperature of 1020° C. for 75 minutes. After cooling the product, its cross-sectional surface was observed through a scanning electron microscope (SEM). As shown in FIG. 4, many voids had been formed in the low-temperature buffer layer under the mask. In addition, as shown in a bird's-eye SEM image as FIG. 5, a GaN layer having a [11-22] facet surface had been formed in the side surface.

Reference Example 2

After the GaN crystal growth in Reference Example 1, an undoped GaN-layer was formed according to the same procedures as the ones in Example 1 till the undoped GaN-layer was grown at a temperature of 1120° C. for 90 minutes in a manner similar to the one in Example 1. After the product was cooled, the bird's-eye SEM image of the GaN crystal was observed. As shown in FIG. 6, a flat film was obtained over the whole surface of the GaN crystal.

Reference Example 3

An undoped GaN-layer was formed according to the same procedures as the ones in Reference Example 2 except that the growth temperature was set to 1100° C. After the product was cooled, the bird's-eye SEM image of the GaN crystal was observed. As shown in FIG. 7, the surface of the GaN crystal was not embedded.

Reference Example 4

An undoped GaN-layer was formed according to the same procedures as the ones in Reference Example 2 except that the growth temperature was set to 1140° C. After the product was cooled, the bird's-eye SEM image of the GaN crystal was observed. As shown in FIG. 8, a flat film was obtained over the whole surface of the GaN crystal.

Comparative Example 2

A GaN layer was laminated by 2 μm over a sapphire substrate as a base substrate according to a two-step growth, and then $SiO_2$ stripes (with stripe width of 5 μm, stripe interval of 5 μm, with the stripes being parallel to the <1-100> direction of the sapphire substrate) were formed on the surface of the GaN layer, followed by finally growing GaN crystal to 35 μm in a reactor so as to form a Group 3-5 nitride semiconductor crystalline layer. After cooled, the product was unloaded from the reactor. However, the GaN layer could not be delaminated from the sapphire substrate.

Figure 1:
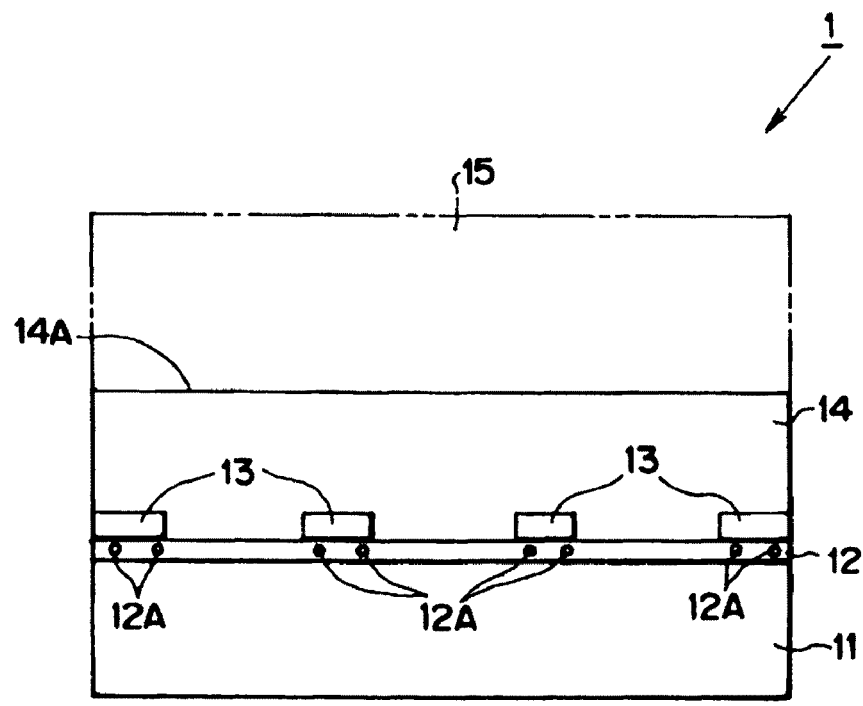
FIG. 1 is a side view of a substrate according to one embodiment of the present invention.
Figure 2:
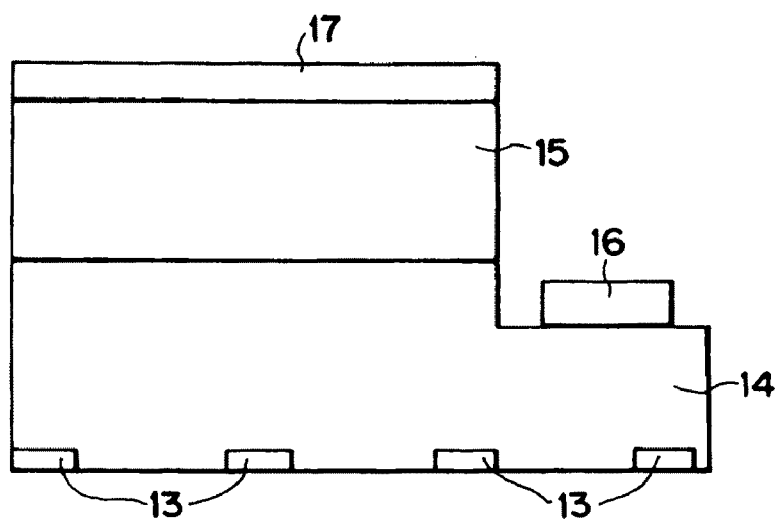
FIG. 2 is a side view of a semiconductor light-emitting device obtained from the substrate shown in FIG. 1.
Figure 3:
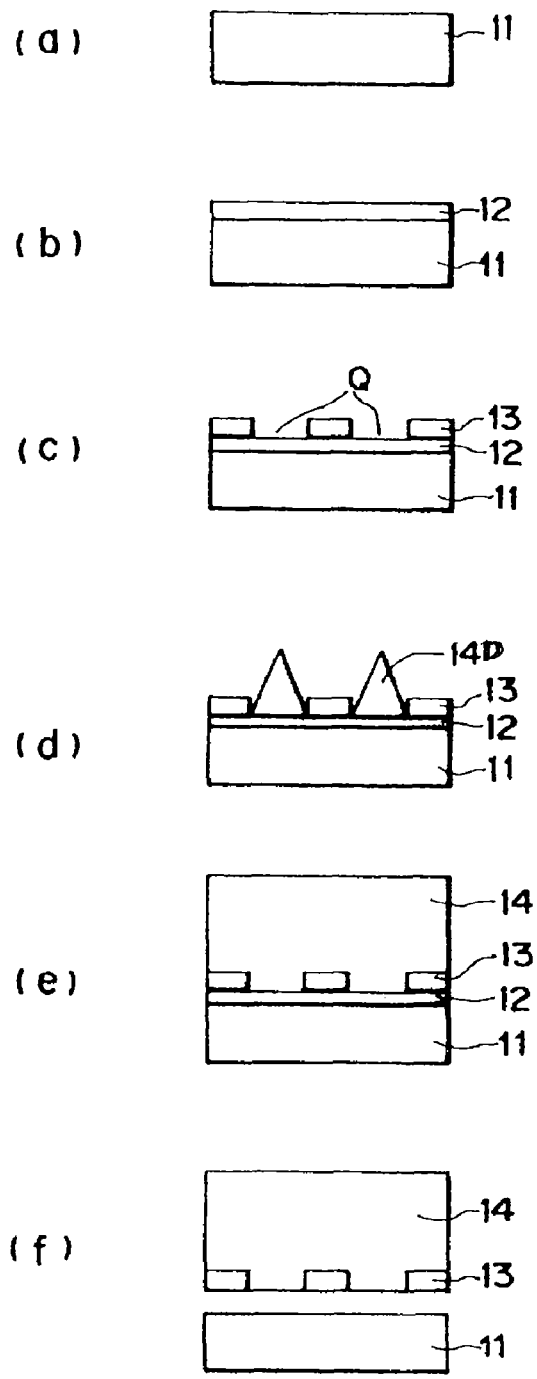
FIG. 3 is a process schematic diagram of another embodiment of the present invention.
Figure 4:
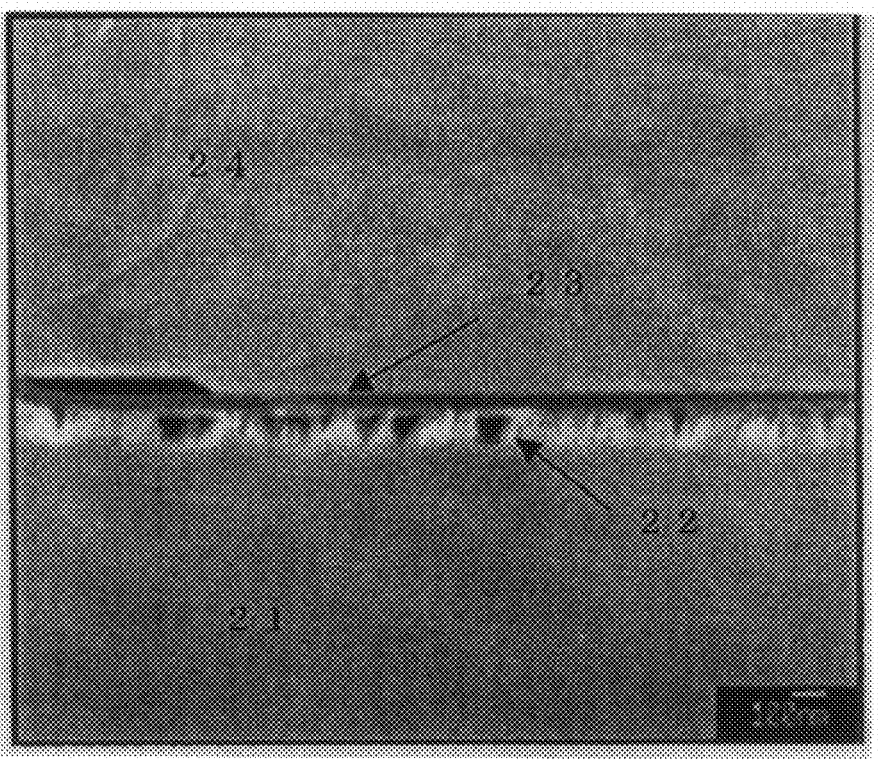
FIG. 4 is a cross-sectional SEM image of Reference Example 1.
Figure 5:
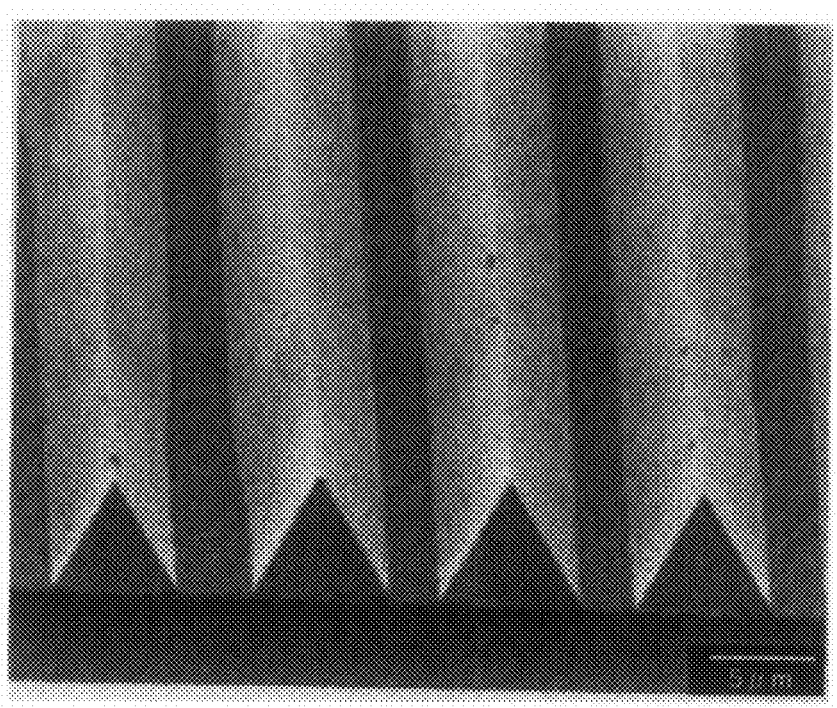
FIG. 5 is a bird's-eye SEM image of Reference Example 1.
Figure 6:
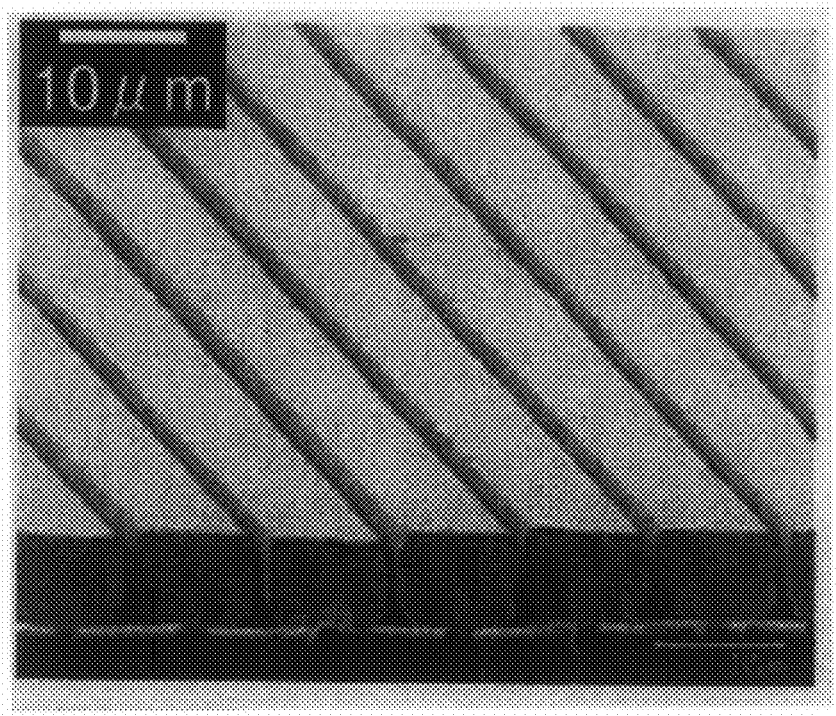
FIG. 6 is a bird's-eye SEM image of Reference Example 2.
Figure 7:
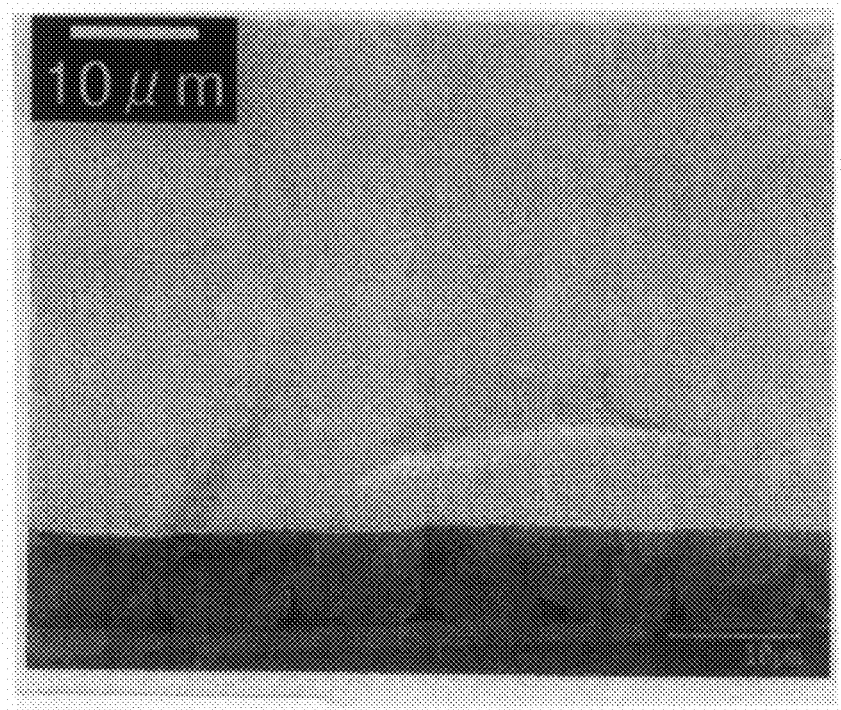
FIG. 7 is a bird's-eye SEM image of Reference Example 3.
Figure 8:
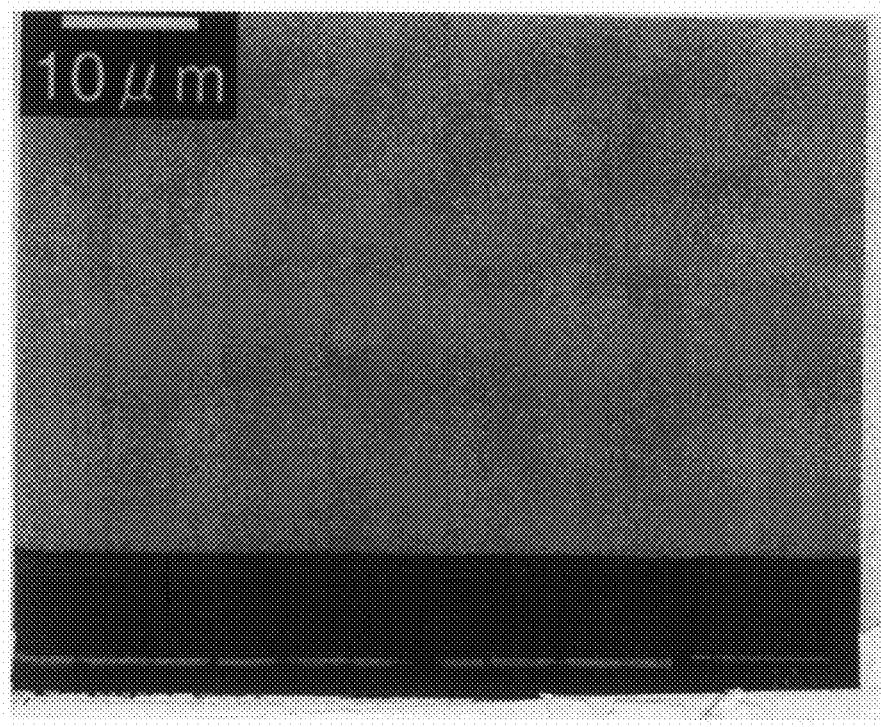
FIG. 8 is a bird's-eye SEM image of Reference Example 4.
Figure 9:
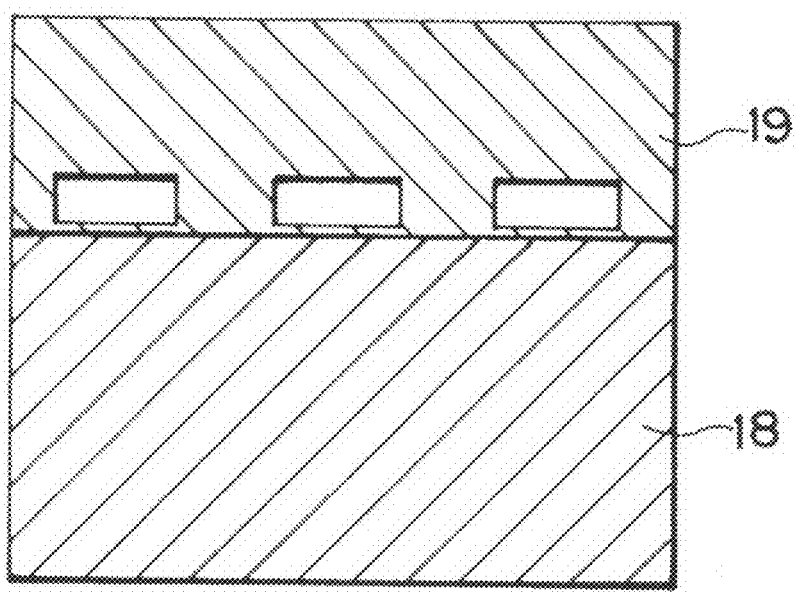
FIG. 9 is a cross-sectional view of a substrate according to another embodiment of the present invention.
Figure 10:
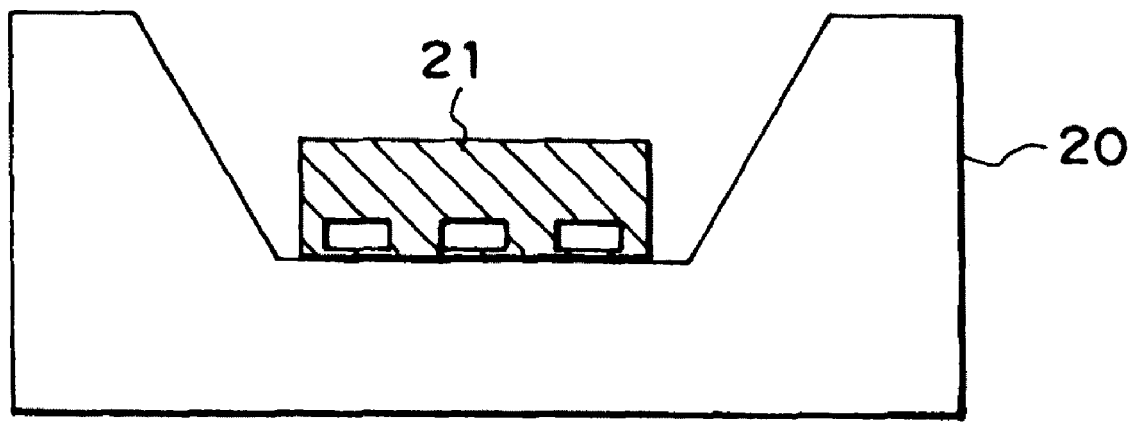
FIG. 10 is a cross-sectional view of a substrate according to another embodiment of the present invention.

The invention claimed is:
1. A Group 3-5 nitride semiconductor multilayer substrate comprising:
a base substrate;
a semiconductor layer with which the base substrate is coated;
a mask with which a portion of an upper surface of the semiconductor layer is coated; and
a Group 3-5 nitride semiconductor crystalline layer with which both an exposed surface of the upper surface of the semiconductor layer, which is not coated with the mask, and the mask are coated,
wherein voids are included within the semiconductor layer and are between the mask and the base substrate,
wherein the semiconductor layer is lower in crystallinity than the Group 3-5 nitride semiconductor crystalline layer, and
wherein the semiconductor layer is a buffer layer of a material having the general formula: $In_xGa_yAl_zN$ wherein $0 \leq x \leq 1$, $0 \leq y \leq 1$, $0 \leq z \leq 1$ and $x+y+z=1$, the buffer layer being grown at a temperature of 400° C. to 700° C.

2. A Group 3-5 nitride semiconductor multilayer substrate according to claim 1, wherein the mask is in the form of stripes or dots, or the unmasked portion is in the form of dots.

3. A Group 3-5 nitride semiconductor multilayer substrate according claim 1, wherein the mask comprises at least one material selected from the group consisting of $SiO_2$, $TiO_2$, $ZrO_2$, $CrO_2$, W, Re, Mo, Cr, Co, Si, Au, Zr, Ta, Ti, Nb, Ni, Pt, V, Hf, Pd, BN, W-nitride, Re-nitride, Mo-nitride, Cr-nitride, Si-nitride, Zr-nitride, Ta-nitride, Ti-nitride, Nb-nitride, V-nitride, Hf-nitride and Fe-nitride.

4. A method of producing a Group 3-5 nitride semiconductor free-standing substrate comprising the steps of:
forming a semiconductor layer over a base substrate;
forming voids within the semiconductor layer;
forming a mask over a portion of an upper surface of the semiconductor layer;
forming a Group 3-5 nitride semiconductor crystalline layer by selective growth such that both an exposed surface of the upper surface of the semiconductor layer, which is not coated with the mask, and the mask are coated with the Group 3-5 nitride semiconductor crystalline layer; and
separating the Group 3-5 nitride semiconductor crystalline layer and the base substrate from each other,
wherein the semiconductor layer is lower in crystallinity than the Group 3-5 nitride semiconductor crystalline layer,
wherein the semiconductor layer is a buffer layer of a material having the general formula: $In_xGa_yAl_zN$ wherein $0 \leq x \leq 1$, $0 \leq y \leq 1$, $0 \leq z \leq 1$ and $x+y+z=1$, the buffer layer being grown at a temperature of 400° C. to 700° C.; and
wherein the voids are between the mask and the base substrate.

5. A method of producing a Group 3-5 nitride semiconductor free-standing substrate according to claim 4, wherein the step of separating comprises the step of mechanically delaminating the base substrate from the Group 3-5 nitride semiconductor crystalline layer by the application of stress.

6. A method of producing a Group 3-5 nitride semiconductor free-standing substrate according to claim 4, wherein further comprising the step of chemically etching at least one of the mask and the semiconductor layer after the step of separating.

7. A method of producing a Group 3-5 nitride semiconductor free-standing substrate according to claim 4, wherein the step of separating comprises the step of delaminating the base substrate from the Group 3-5 nitride semiconductor crystalline layer by lowering atmosphere temperature.

8. A Group 3-5 nitride semiconductor free-standing substrate produced according claim 4.

9. A semiconductor device comprising a Group 3-5 nitride semiconductor multilayer substrate according claim 1.

10. A semiconductor device comprising a Group 3-5 nitride semiconductor free-standing substrate according to claim 8.

* * * * *